(12) United States Patent
Naito

(10) Patent No.: US 10,741,547 B2
(45) Date of Patent: Aug. 11, 2020

(54) SEMICONDUCTOR DEVICE

(71) Applicant: FUJI ELECTRIC CO.,LTD., Kangawa (JP)

(72) Inventor: Tatsuya Naito, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 4 days.

(21) Appl. No.: 16/141,972

(22) Filed: Sep. 26, 2018

(65) Prior Publication Data
US 2019/0027472 A1 Jan. 24, 2019

Related U.S. Application Data

(63) Continuation of application No. PCT/JP2017/037405, filed on Oct. 16, 2017.

(30) Foreign Application Priority Data

Oct. 17, 2016 (JP) .................................. 2016-203433

(51) Int. Cl.
*H01L 27/06* (2006.01)
*H01L 29/06* (2006.01)
(Continued)

(52) U.S. Cl.
CPC ...... *H01L 27/0635* (2013.01); *H01L 29/0696* (2013.01); *H01L 29/1095* (2013.01);
(Continued)

(58) Field of Classification Search
None
See application file for complete search history.

(56) References Cited

U.S. PATENT DOCUMENTS

2002/0030237 A1* 3/2002 Omura ................ H01L 29/8725
257/397
2009/0020810 A1* 1/2009 Marchant ............. H01L 29/407
257/331
(Continued)

FOREIGN PATENT DOCUMENTS

JP 2002083963 A 3/2002
JP 2012190938 A 10/2012
(Continued)

OTHER PUBLICATIONS

International Search Report for International Patent Application No. PCT/JP2017/037405, issued by the Japan Patent Office dated Dec. 26, 2017.

*Primary Examiner* — Steven M Christopher

(57) ABSTRACT

A semiconductor device includes: a first conductivity-type semiconductor substrate; a second conductivity-type base region provided on a front surface side inside the semiconductor substrate, a gate trench portion provided inside the semiconductor substrate and penetrating the base region from a front surface of the semiconductor substrate, the gate trench portion having a gate conductive portion, and a dummy trench portion provided inside the semiconductor substrate and penetrating the base region from a front surface of the semiconductor substrate, the dummy trench portion including an upper dummy conductive portion having an emitter potential and a lower gate conductive portion positioned below the upper dummy conductive portion and having a gate potential, wherein the lower gate conductive portion of the dummy trench portion is connected to the gate conductive portion of the gate trench portion.

12 Claims, 15 Drawing Sheets

(51) Int. Cl.
  *H01L 29/40*   (2006.01)
  *H01L 29/10*   (2006.01)
  *H01L 29/423*  (2006.01)
  *H01L 29/739*  (2006.01)
  *H01L 29/78*   (2006.01)
  *H01L 29/12*   (2006.01)
  *H01L 29/861*  (2006.01)
  *H01L 29/868*  (2006.01)
  *H01L 29/36*   (2006.01)
  *H01L 27/07*   (2006.01)

(52) U.S. Cl.
  CPC .............. *H01L 29/12* (2013.01); *H01L 29/36* (2013.01); *H01L 29/407* (2013.01); *H01L 29/4236* (2013.01); *H01L 29/4238* (2013.01); *H01L 29/42376* (2013.01); *H01L 29/739* (2013.01); *H01L 29/7397* (2013.01); *H01L 29/78* (2013.01); *H01L 29/861* (2013.01); *H01L 29/868* (2013.01); *H01L 29/8613* (2013.01); *H01L 27/0727* (2013.01)

(56) References Cited

U.S. PATENT DOCUMENTS

| | | | |
|---|---|---|---|
| 2012/0104555 A1* | 5/2012 | Bobde | H01L 29/0696 257/587 |
| 2014/0003109 A1 | 1/2014 | Shiraishi | |
| 2014/0054645 A1 | 2/2014 | Saito et al. | |
| 2015/0295042 A1 | 10/2015 | Kameyama et al. | |
| 2017/0069741 A1* | 3/2017 | Na | H01L 29/7397 |
| 2017/0250179 A1 | 8/2017 | Senoo et al. | |

FOREIGN PATENT DOCUMENTS

| | | |
|---|---|---|
| JP | 2013150000 A | 8/2013 |
| JP | 2014011212 A | 1/2014 |
| JP | 2016092177 A | 5/2016 |
| JP | 2016174029 A | 9/2016 |
| WO | 2014097454 A1 | 6/2014 |
| WO | 2016014224 A1 | 1/2016 |

* cited by examiner

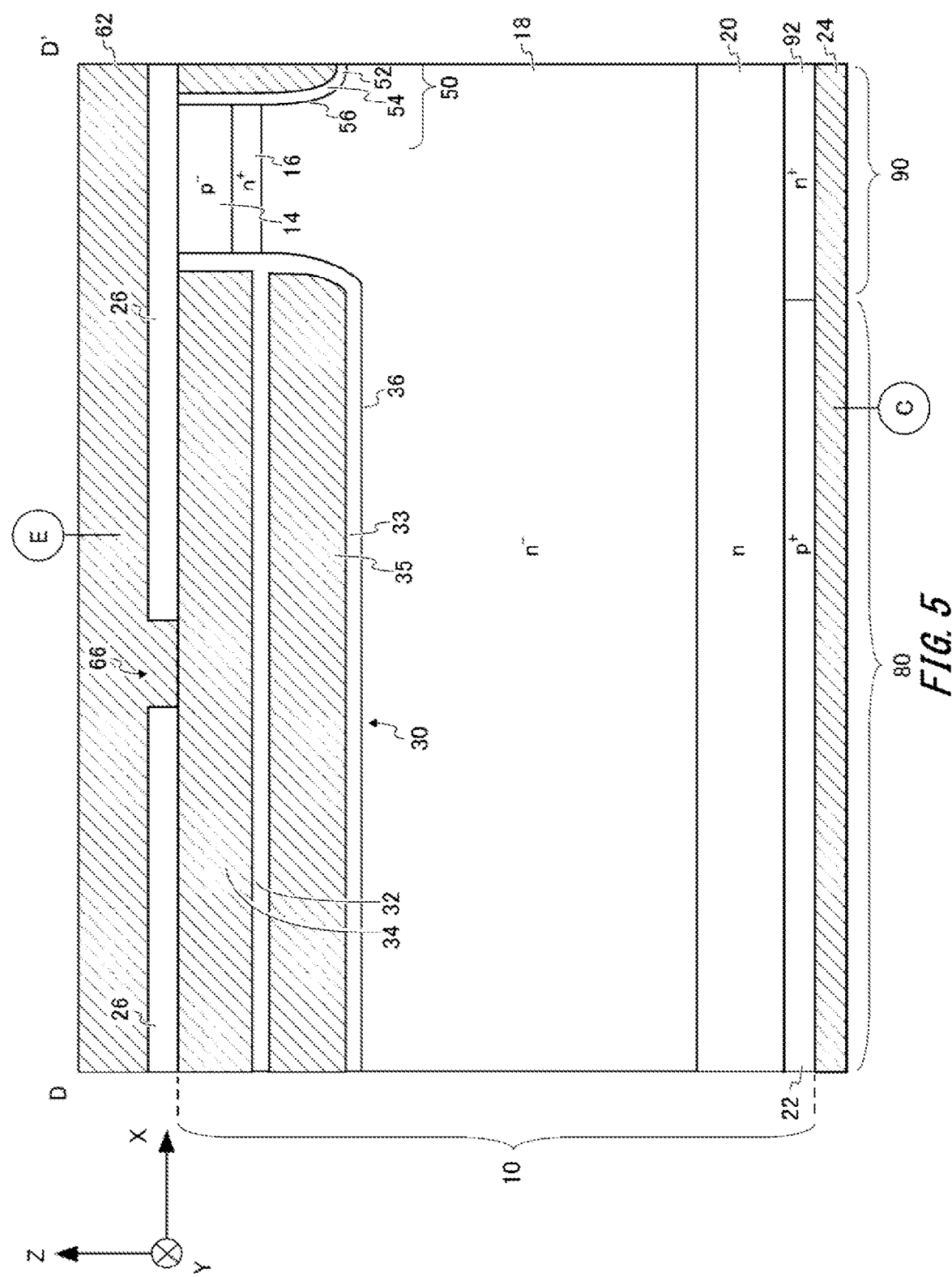

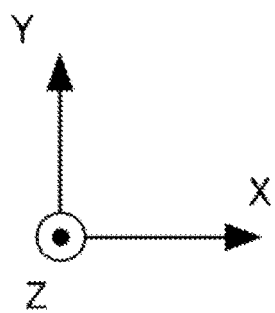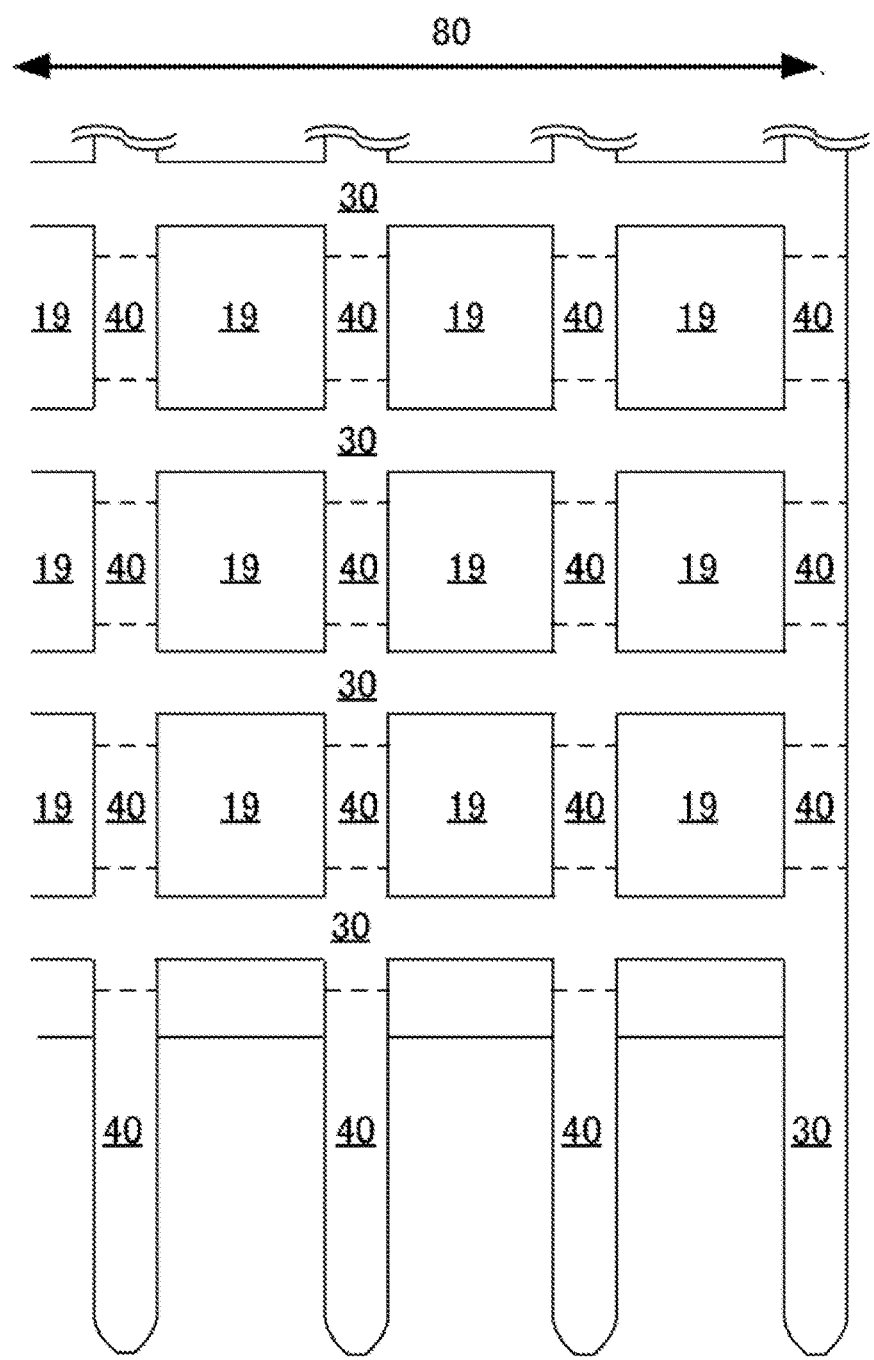
FIG. 6A

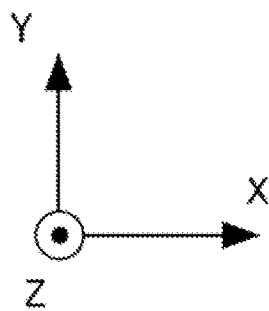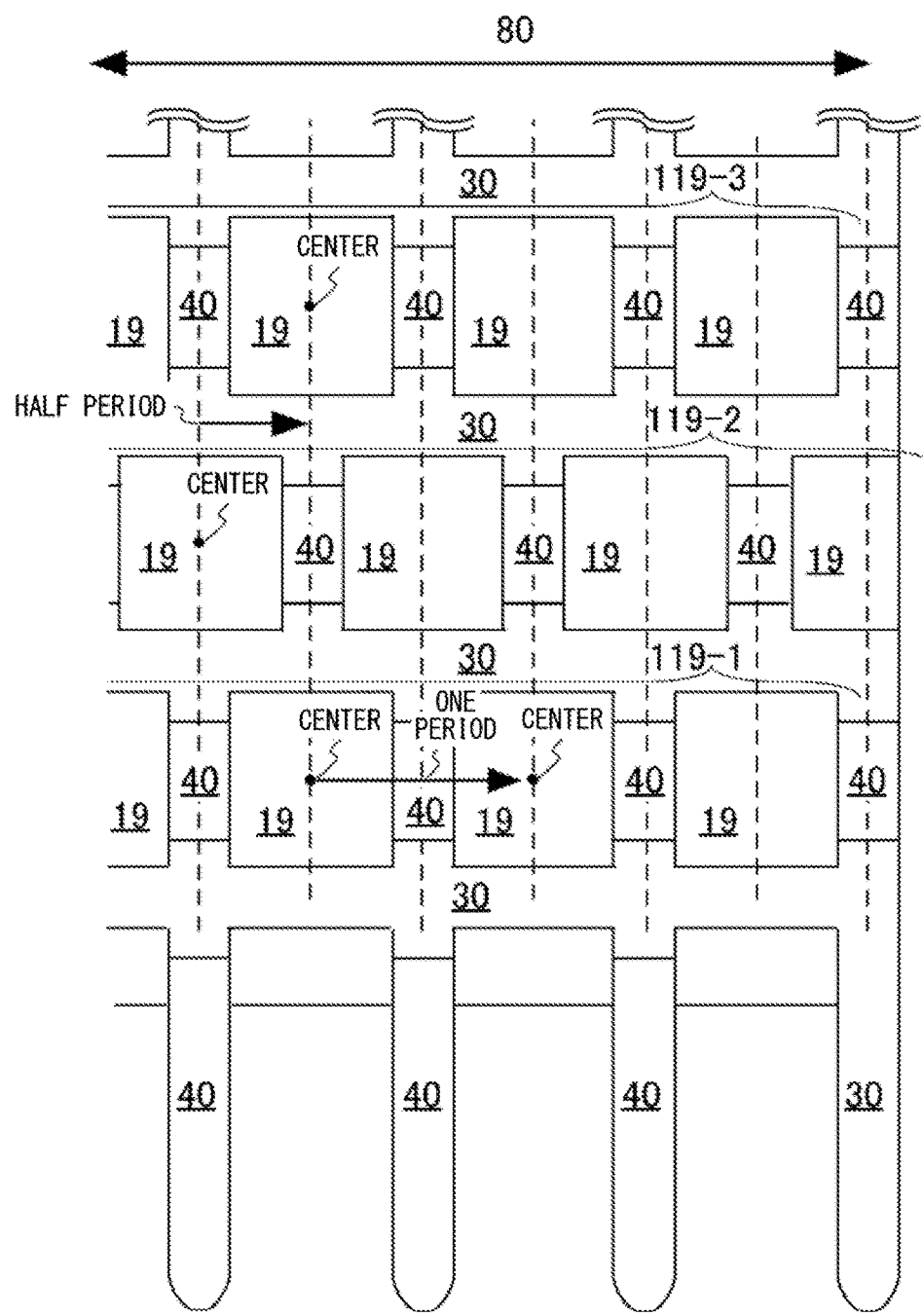
FIG. 6B

SEMICONDUCTOR DEVICE

The contents of the following Japanese patent applications are incorporated herein by reference:
NO. 2016-203433 filed in JP on Oct. 17, 2016, and
NO. PCT/JP2017/037405 filed on Oct. 16, 2017.

BACKGROUND

1. Technical Field

The present invention relates to a semiconductor device.

2. Related Art

It is known that a gate trench is provided to have a rectangular ring shape. (see Patent document 1, for example). Also, it is known that a gate trench and a dummy trench are respectively provided to have a rectangular ring shape. (see Patent document 2, for example).

PRIOR ART DOCUMENTS

Patent Documents

Patent Document 1: Japanese Patent Application Publication No. 2013-150000
Patent Document 2: Japanese Patent Application Publication No. 2016-092177

SUMMARY

When the ratio of the dummy trench portion, having the conductive portion which is an emitter potential, with respect to the gate trench portion, is increased, the capacitance between the collector and the gate (hereinafter, $C_{CG}$) is decreased and the capacitance between the collector and the emitter (hereinafter, $C_{CE}$) is increased. Thereby, the oscillation phenomenon is likely to occur.

A first aspect of the present invention provides a semiconductor device. The semiconductor device may include a semiconductor substrate, a base region, gate trench portions, and dummy trench portions. The semiconductor substrate may be of the first conductivity-type. The base region may be provided at a front surface side inside the semiconductor substrate. The base region may be of the second conductivity-type. The gate trench portion may be provided inside the semiconductor substrate and penetrating through the base region from a front surface of the semiconductor substrate. The gate trench portion may have a gate conductive portion. The dummy trench portion may be provided inside the semiconductor substrate and penetrating through the base region from a front surface of the semiconductor substrate. The dummy trench portion may include an upper dummy conductive portion and a lower gate conductive portion. The upper dummy conductive portion may have an emitter potential. The lower gate conductive portion may be positioned below the upper dummy conductive portion. The lower gate conductive portion may have a gate potential. The lower gate conductive portion of the dummy trench portion may be connected to the gate conductive portion of the gate trench portion.

In the front surface of the semiconductor substrate, a plurality of the gate trench portions and a plurality of the dummy trench portions may surround a mesa region. The mesa region may be provided in a transistor section of the semiconductor device. The mesa region may have a base region.

In a front surface of the semiconductor substrate, the dummy trench portion may have a first straight line portion, a second straight line portion, and an intersecting portion. The first straight line portion may extend in a first direction. The second straight line portion may extend in a second direction. The second direction may be orthogonal relative to the first direction. In the intersecting portion, the first straight line portion and the second straight line portion may intersect with each other.

In a front surface of the semiconductor substrate, a plurality of the mesa regions may be provided being arranged side by side linearly in a first direction and a second direction.

In the front surface of the semiconductor substrate, a plurality of the mesa regions which are provided in the transistor section of the semiconductor device and respectively have a base region, may include a first group, a second group, and a third group. In the first group, respective mesa regions may be provided being arranged side by side linearly in the first direction. In the second group, respective mesa regions may be provided being arranged side by side linearly in the first direction. In the second group, each mesa region may be the closest to the first group in the second direction. In the second group, each mesa region may be provided so as to be shifted from each other by a half period in the first direction with respect to each mesa region of the first group. In the third group, respective mesa regions may be provided being arranged side by side linearly in the first direction. In the third group, each mesa region may be the second closest to the first group in the second direction. In the third group, each mesa region may be provided being arranged side by side in the second direction with respect to each mesa region of the first group.

The dummy trench portion may be provided in direct contact with a side parallel to the first direction of the mesa region on the front surface of the semiconductor substrate. The gate trench portion may be provided in direct contact with a side parallel to the second direction of the mesa region on the front surface of the semiconductor substrate.

The semiconductor device may further include a diode section in direct contact with a transistor section of the semiconductor device. Each of a plurality of the dummy trench portions provided in the transistor section and the diode section may have the lower gate conductive portion. At least one of a plurality of the dummy trench portions may not have the lower gate conductive portion.

The semiconductor device may further include a diode section in direct contact with a transistor section of the semiconductor device. In a plurality of the second straight line portions closest to the diode section among a plurality of the dummy trench portions in the transistor section, second straight line portions adjacent to each other in the second direction may be coupled to each other. A plurality of the second straight line portions which are the closest to the diode section may not have the lower gate conductive portion.

The lower gate conductive portion of the dummy trench portion may be provided below the base region.

The dummy trench portion may have an upper insulating film and a lower insulating film. The upper insulating film may be provided on a side portion and a bottom portion of the upper dummy conductive portion. The lower insulating film may be provided on a side portion and a bottom portion of the lower gate conductive portion. The lower insulating film may be thicker than the upper insulating film.

The semiconductor substrate may have a first conductivity-type drift region. The drift region may be positioned under the base region. The upper insulating film of the dummy trench portion may not be in contact with the drift region. The lower insulating film of the dummy trench portion may be in contact with the drift region.

The summary clause does not necessarily describe all necessary features of the embodiments of the present invention. The present invention may also be a sub-combination of the features described above.

BRIEF DESCRIPTION OF THE DRAWINGS

FIG. 5 shows a cross section taken along D-D' in FIG. 1.

FIG. 6A is a diagram showing a mesa region 19, a dummy trench portion 30 and a gate trench portion 40 in a first embodiment.

FIG. 6B is a diagram showing a mesa region 19, a dummy trench portion 30 and a gate trench portion 40 in a modification example of the first embodiment.

DESCRIPTION OF EXEMPLARY EMBODIMENTS

Hereinafter, (some) embodiment(s) of the present invention will be described. The embodiment(s) do(es) not limit the invention according to the claims, and all the combinations of the features described in the embodiment(s) are not necessarily essential to means provided by aspects of the invention.

Figure 1:
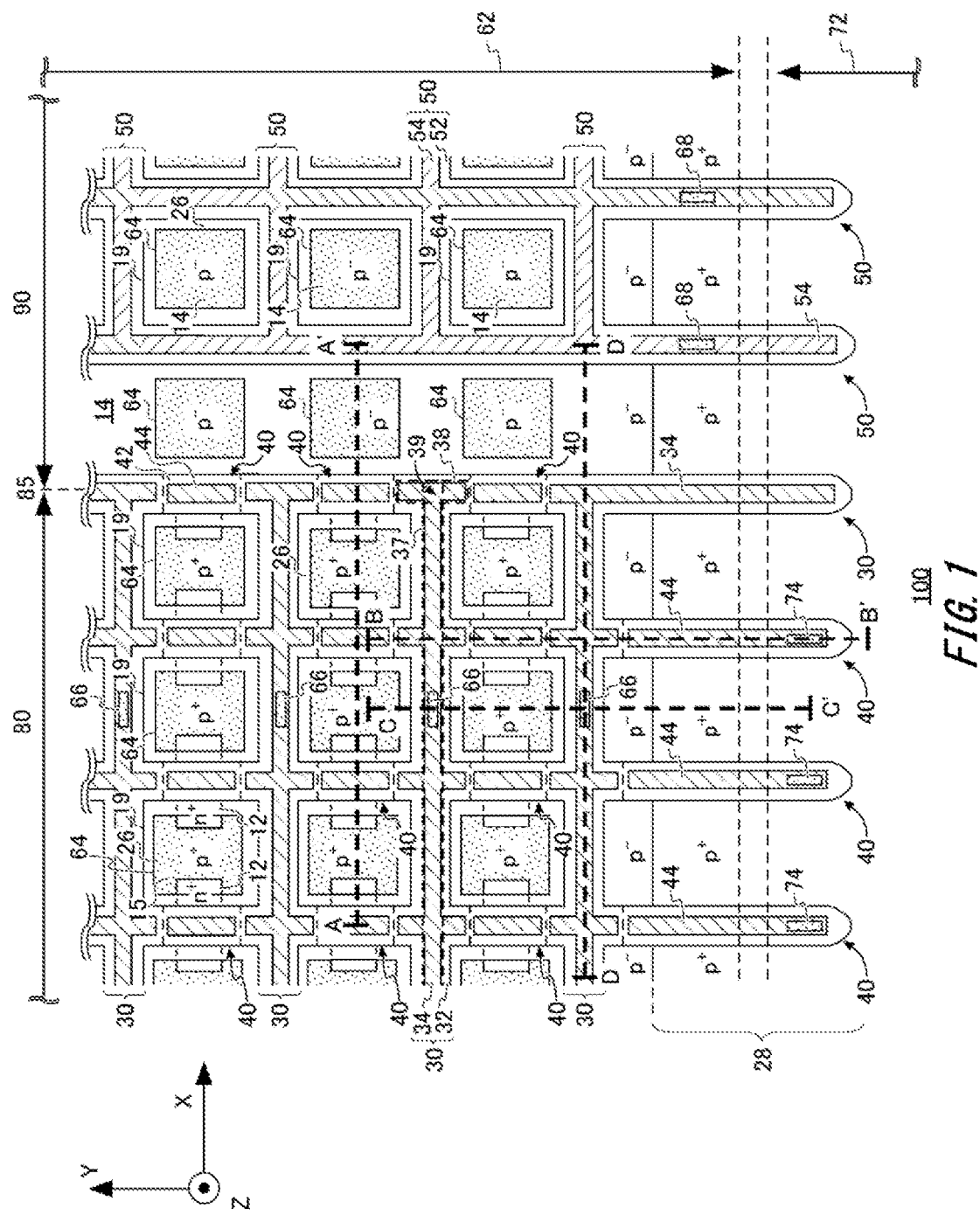
FIG. 1 is a top view of a semiconductor device 100 according to a first embodiment.

FIG. 1 is a top view of a semiconductor device 100 according to a first embodiment. The semiconductor device 100 of the present example has an IGBT section 80 provided with an IGBT (Insulated Gate Bipolar Transistor) and an FWD section 90 provided with an FWD (Free Wheeling Diode). The IGBT section 80 is one example of a transistor section. Another example of the transistor section may be a MOSFET (Metal Oxide Semiconductor Field Effect Transistor). The FWD section 90 is one example of a diode section. The semiconductor device 100 of the present example is an RC-IGBT (Reverse-Conducting IGBT) in which the IGBT section 80 and the FWD section 90 are integrally formed on one semiconductor substrate.

The IGBT section 80 of the present example is in direct contact with the FWD section 90 in the X-direction. In the present example, the X-direction and the Y-direction are directions orthogonal to each other. The X-direction is one example of the first direction, and the Y-direction is one example of the second direction. The Z-direction is a direction perpendicular to the X-Y plane. The X, Y and Z directions form a so-called right-handed system. Note that, the expressions "on" and "above" in the present example mean the direction from the back surface toward the front surface of the semiconductor substrate (+Z-direction). In contrast, the expressions "under" and "below" mean the −Z-direction, which is a direction opposite to the +Z-direction. In the present example, the expressions "on" and "under" are merely convenient expressions to describe a relative positional relationship. The Z-direction does not necessarily mean the gravity direction or a direction perpendicular to the ground.

FIG. 1 shows an active region around an end portion of the semiconductor substrate, and other regions such as center portions of the semiconductor substrate and edge termination sections positioned at the end portion of the semiconductor substrate are omitted. The semiconductor device 100 may have an edge termination section that surrounds the active section as seen from top. The active section in the present example refers to a region including the IGBT section 80 and the FWD section 90. The edge termination section has a function to relieve electric field concentration on the front surface side of the semiconductor substrate. The edge termination section has, for example, a guard ring, a field plate, a RESURF, or a structure of two or more of these are combined.

At the front surface side inside the semiconductor substrate, the semiconductor device 100 of the present example includes an $n^+$-type emitter region 12, a $p^-$-type base region 14, a $p^+$-type contact region 15, a $p^+$-type well region 28, a dummy trench portion 30, a gate trench portion 40, and a dummy trench portion 50. Note that, the letters "n" and "p" respectively mean that the electrons and holes are majority carriers. Also, the letter "n" or "p" may be accompanied by the superscript "+" or "−" at its right side. The letter with "+" means a higher carrier concentration than the letter without "+", while the letter with "−" means a lower carrier concentration than the letter without "−".

The semiconductor substrate of the present example is a first conductivity-type silicon substrate, however, it may be a first conductivity-type silicon carbide substrate, or may be a first conductivity-type gallium nitride substrate. In the present example, the first conductivity-type is n-type, and the semiconductor substrate of the present example is an $n^-$-type silicon substrate. A second conductivity-type base region 14 is provided in the IGBT section 80 and the FWD section 90. In the present example, the second conductivity-type is p-type. Note that the conductivity types of a substrate, a region and another portion described in each example may each be reversed from those conductivity types.

FIG. 1 shows contact holes 64, 66, and 74 provided in an interlayer insulating film 26 provided on the front surface of the semiconductor substrate, and contact holes 68 provided in the interlayer insulating film 26 of the FWD section 90. The contact holes 64, 66, and 68 provide electrical connection between the emitter electrode 62 and the front surface. In contrast, the contact holes 74 provide electrical connection between the gate metal layer 72 and the front surface.

[IGBT section 80] The IGBT section 80 of the present example has a plurality of mesa regions 19. Each mesa region 19 has a base region 14. The base region 14 of the IGBT section 80 is exposed at the front surface of the semiconductor substrate at a surrounding portion of the mesa region 19. The mesa region 19 of the present example is surrounded on all four sides by two gate trench portions 40 and two dummy trench portions 50, at the front surface of the semiconductor substrate. The dummy trench portion 30 of the present example is in direct contact with a side parallel to the X-direction of the mesa region 19. Also, the gate trench portion of the present example is provided being in direct contact with a side parallel to the Y-direction of the mesa region 19. Note that, the shape of the mesa region 19 as seen from top is not limited to a rectangle, and may be a pentagon or a polygon with a larger number of sides.

The mesa region 19 of the IGBT section 80 of the present example has a plurality of emitter regions 12. The emitter region 12 is exposed at the front surface of the semiconductor substrate at the surrounding portion of the mesa region 19. The emitter regions 12 of the present example are provided near the midpoints in the Y-direction of the mesa region 19, and at end portions in the ±X-direction of the mesa region 19. That is, in the present example, one mesa region 19 has two emitter regions 12. The emitter region 12 of the present example has a band shape extending in the Y-direction.

The mesa region 19 of the IGBT section 80 of the present example has a contact region 15. The contact region 15 is exposed at the front surface of the semiconductor substrate at a central portion of the mesa region 19. The contact region 15 is provided in a smaller range than the mesa region 19. The contact region 15 of the present example has a rectangular shape similar to the mesa region 19. The contact region 15 of the present example is exposed in an opening portion of the contact holes 64. Note that, The contact hole 64 of the present example has a rectangular shape similar to the mesa region 19, like the contact region 15. The contact hole 64 has an opening inside the boundaries in FIG. 1. For example, the emitter electrode 62 and the contact region 15 are connected to each other inside the contact hole 64.

The dummy trench portion 30 and the gate trench portion 40 are provided penetrating through the base region 14 from the front surface side of the semiconductor substrate. In the present example, a situation where the trench portion penetrates through the base region 14 refers to a situation where the base region 14 provided on the entire front surface side is separated by etching as seen from top.

The dummy trench portion 30 of the present example has at least an upper insulating film 32 formed on an inner wall of the dummy trench and an upper dummy conductive portion 34 formed inside the dummy trench with its inner wall covered by the upper insulating film 32. The upper dummy conductive portion 34 is connected to the emitter electrode 62 via the contact hole 66. Note that, the emitter electrode 62 of the present example extends from the well region 28 in the +Y-direction, and covers the entire IGBT section 80 and the entire FWD section 90. Note that, the well region 28 is provided at a position in the further −Y-direction than the base region 14 positioned at the −Y-direction end portion.

The dummy trench portion 30 has a first straight line portion 37, a second straight line portion 38, and an intersecting portion 39. In the present example, the first straight line portion 37, the second straight line portion 38, and the intersecting portion 39 are shown in the dummy trench portion 30 in direct contact with the mesa region 19 at the −Y-direction end portion of the IGBT section 80. Note that, each dummy trench portion 30 of the IGBT section 80 may have a first straight line portion 37, a second straight line portion 38, and an intersecting portion 39 similarly.

One first straight line portion 37 and one second straight line portion 38 are indicated being surrounded by dotted lines. Also, one intersecting portion 39 is indicated by an arrow. The first straight line portion 37 extends in the X-direction. In contrast, the second straight line portion 38 extends in the Y-direction. In the present example, a plurality of first straight line portions 37 are orthogonal relative to one second straight line portion 38. The position at which the first straight line portion 37 and the second straight line portion 38 intersect is referred to as the intersecting portion 39.

The dummy trench of the dummy trench portion 30 has a predetermined depth. In the present example, because the dummy trench portion 30 in addition to the gate trench portion 40 are provided, carrier accumulation effect in which holes are accumulated between the trenches can be obtained. This can reduce the on-state voltage drop. Also, because in the dummy trench portion 30 of the present example, the first straight line portion 37 and the second straight line portion 38 are orthogonally crossed at the intersecting portion 39 without being spaced away from each other, the carrier accumulation effect can be improved compared to the case where the intersecting portion 39 is not provided.

Note that, The dummy trench of the intersecting portion 39 may be deeper than the dummy trenches of the first straight line portion 37 and the second straight line portion 38. If the intersecting portion 39 is provided in the gate trench portion 40, the gate threshold voltage near the intersecting portion 39 can be different from the gate threshold voltage of the first straight line portion 37 and the second straight line portion 38. That is, a problem that that the gate threshold voltage varies depending on the place of the gate trench portion 40 occurs. In contrast, in the present example, because the intersecting portion 39 is provided in the dummy trench portion 30 and the intersecting portion 39 is not provided in the gate trench portion 40, the problem that the gate threshold voltage varies can be avoided.

The gate trench portion 40 has an insulating film 42 formed on the inner wall of the gate trench, and a gate conductive portion 44 formed inside the gate trench with its inner wall covered by the insulating film 42. The gate conductive portion 44 has a function to control the channel of the IGBT. The gate conductive portion 44 is connected to the gate metal layer 72 via the contact hole 74. The gate metal layer 72 of the present example at least covers a part of the dummy trench portion 30 and the gate trench portion 40 positioned at the end portion in the −Y-direction. The gate metal layer 72 of the present example is provided mainly on the well region 28.

When a predetermined voltage is applied to the gate conductive portion 44 formed inside the gate trench portion 40, a channel is formed in a region in contact with the gate trench portion 40 at the p-type base region formed below the emitter region 12. After a channel is formed when a predetermined low potential (for example, ground potential) is applied to the emitter electrode 62, and a predetermined high potential (for example, tens of volts to thousands of volts) is applied to the collector electrode provided on the back surface of the semiconductor substrate, a current flows from the collector electrode to the emitter electrode 62 via the channel.

In the present example, because the mesa region 19 is surrounded by the dummy trench portions 30 and the gate trench portions 40, the density of the gate trench portion 40 at the front surface of the semiconductor substrate can be easily adjusted in the design stage of the semiconductor device 100. Specifically, by coupling the two first straight line portions 37, the gate trench portion 40 can be made the dummy trench portion 30. Thereby, the ratio of the occupancy area of the gate trench portion 40 with respect to the occupancy area of the dummy trench portion 30 can be easily adjusted. Note that, The trenches that the dummy trench portion 30 has and the trenches that the gate trench portion 40 of the present example have the same depth.

Note that, in the present example, the gate trench portion 40 positioned partially below the gate metal layer 72 has a linear shape extending in the Y-direction. However, the two gate trench portions 40 may be coupled in a U-shape at the −Y-direction end portion. That is, the two gate trench portions 40 positioned partially below the gate metal layer 72 may constitute a U-shaped longitudinal portion and be coupled to each other by a U-shaped shorter portion.

Also, by relatively increasing the ratio of the occupancy area of the gate trench portion 40, the parasitic gate capacitance can be increased, and by relatively increasing the ratio of the occupancy area of the dummy trench portion 30, the parasitic gate capacitance can be decreased. In this manner, in the semiconductor device 100 of the present example, the parasitic gate capacitance can be easily adjusted to a desired value in the design stage of the semiconductor device 100.

[FWD section 90] In the present example, the FWD sections 90 near the boundary portion 85 between the IGBT section 80 and the FWD section 90 do not have the mesa region 19 surrounded on all four sides by some trench portion. In the FWD sections 90 near the boundary portion 85, the base region 14 extends in the +Y-direction. The FWD section 90 of the present example has a dummy trench portion 50. The dummy trench portions 50 are in direct contact with the +X-direction in the base region 14 near the boundary portion 85 between the IGBT section 80 and the FWD section 90.

The dummy trench portion 50 has at least an insulating film 52 formed on the inner wall of the dummy trench, and a dummy conductive portion 54 formed inside the dummy trench with its inner wall covered by the insulating film 52. The dummy conductive portion 54 is connected to the emitter electrode 62 via the contact hole 68. A plurality of mesa regions 19 are provided in a region surrounded by the dummy trench portions 50. Each mesa region 19 in the FWD section 90 has a base region 14. Because the configuration of the base region 14 is the same as that of the base region 14 of the IGBT section 80, overlapping descriptions are omitted. Note that, the mesa region 19 of the FWD section 90 does not have the emitter region 12 and the contact region 15.

Figure 2:
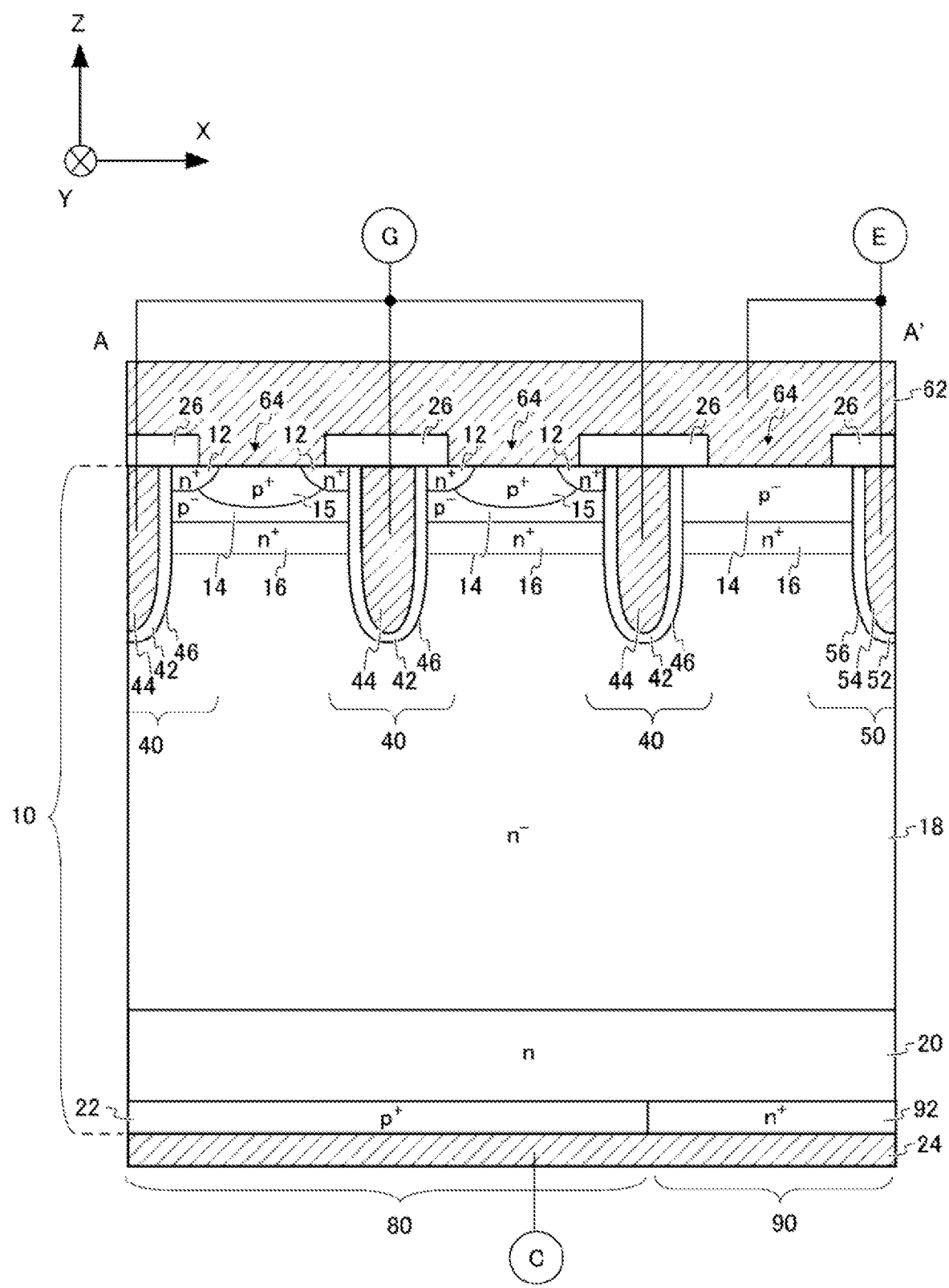
FIG. 2 shows a cross section taken along A-A' in FIG. 1.

FIG. 2 shows a cross section taken along A-A' in FIG. 1. The A-A' cross section is a cross-sectional view that passes through the IGBT section 80 and the FWD section 90. Circled letters "E", "G" and "C" mean an emitter terminal, a gate terminal, and a collector terminal, respectively. The emitter terminal is electrically connected to the emitter electrode 62 positioned on the front surface of the semiconductor substrate 10. In contrast, the collector terminal is electrically connected to the collector electrode 24 positioned below the back surface of the semiconductor substrate 10. Note that, the gate conductive portion 44 and the emitter electrode 62 are electrically separated from each other by the interlayer insulating film 26.

The semiconductor substrate 10 of the present example has an n$^+$-type accumulation region 16 on the more back surface side than the base region 14 and on the more front surface side than the bottom portion of the gate trench 46. The accumulation region 16 of the present example is provided across the IGBT section 80 and the FWD section 90. The semiconductor substrate 10 has an n$^-$-type drift region 18 below the accumulation region 16. That is, the drift region 18 is positioned below the base region 14. Also, the semiconductor substrate 10 has an n-type buffer region 20 below the drift region 18. Furthermore, the semiconductor substrate 10 has a p$^+$-type collector region 22 below the buffer region 20 in the IGBT section 80, and an n$^+$-type cathode region 92 below the buffer region 20 in the FWD section 90. Also, a collector electrode 24 is provided below the collector region 22 and the cathode region 92. The IGBT section 80 of the present example is, in the active region, positioned in a region where predetermined unit configurations including the emitter region 12 and the contact region 15 are regularly arranged, the region being projection region when the collector region 22 is projected in a direction perpendicular to the back surface of the semiconductor substrate 10 with respect to the front surface in the active region. Also, the FWD section 90 of the present example is, in the active region, positioned in a region of a back surface corresponding to the cathode region 92, or a projection region when the cathode region 92 is projected in a direction perpendicular to the back surface of the semiconductor substrate 10 with respect to the front surface.

The n-type impurity concentration of the buffer region 20 is higher than the n-type impurity concentration of the drift region 18. The buffer region 20 may function as a field stop layer that prevents a depletion layer spreading from the back surface side of the base region 14 from reaching the collector region 22. Note that, in FIG. 2, the gate trench 46 in the gate trench portion 40 and the dummy trench 56 in the dummy trench portion 50 are shown. The gate trench 46 and the dummy trench 56 refer to the outline of the trench portion formed by etching. The gate trench 46 and the dummy trench 56 may have the same depth, or may have different depths.

Figure 3:
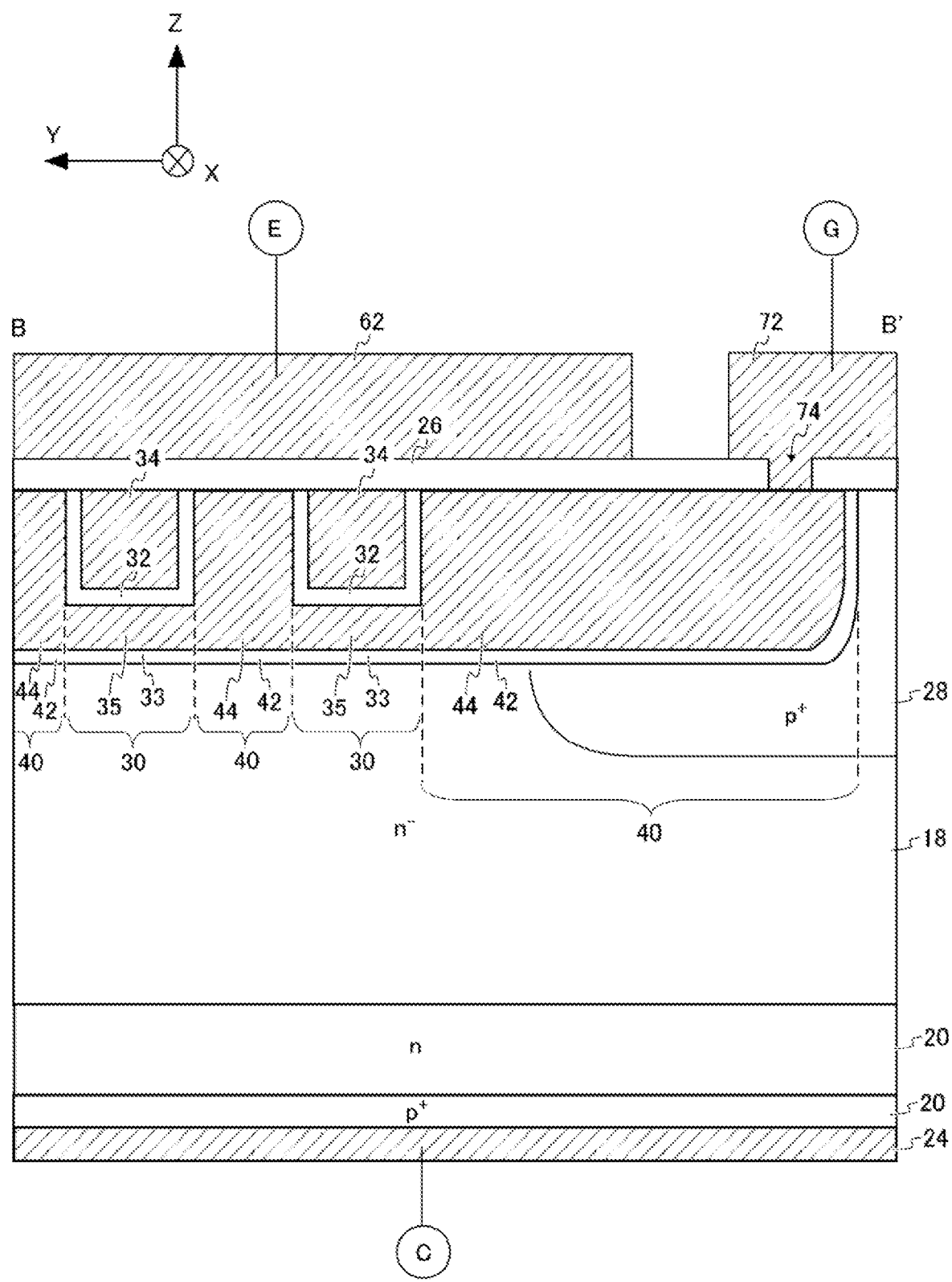
FIG. 3 shows a cross section taken along B-B' in FIG. 1.

FIG. 3 shows a cross section taken along B-B' in FIG. 1. The B-B' cross section is a cross-sectional view that passes through the dummy trench portion 30 and the gate trench portion 40 of the IGBT section 80. "G" surrounded by a circle means a gate terminal. The gate terminal is electrically connected to the gate metal layer 72.

The dummy trench portion 30 has an upper insulating film 32 and an upper dummy conductive portion 34, a lower insulating film 33 and a lower gate conductive portion 35. The lower gate conductive portion 35 is positioned below the upper dummy conductive portion 34. The lower gate conductive portion 35 is provided inside a dummy trench with its inner wall covered by the lower insulating film 33. The upper dummy conductive portion 34 and the lower gate conductive portion 35 are electrically separated from each other by the upper insulating film 32.

The lower gate conductive portion 35 is connected to the gate conductive portion 44 of the gate trench portion 40. Therefore, the lower gate conductive portion 35 has a gate potential. In contrast, the upper dummy conductive portion 34 has an emitter potential. In the present example, because the gate conductive portions 44 are connected to each other via the lower gate conductive portions 35, not connected to each other via additional wirings and contact holes, the semiconductor device 100 is miniaturized easily.

If all of the conductive portions of the dummy trench portion 30 are the conductive portions of the emitter potential, because if the ratio of the occupancy area of the dummy trench portion 30 with respect to the gate trench portion 40 is increased, the $C_{CG}$ is correspondingly decreased and the $C_{CE}$ is increased, so an oscillation phenomenon (a phenomenon in which the output of the semiconductor device oscillates as the gate is turned on and off) is likely to occur. If the $C_{CG}$ is decreased, the switching speed of the gate increases. Thereby, because the voltage change per unit time (dv/dt) increases, an oscillation phenomenon occurs. In contrast, the dummy trench portion 30 of the IGBT section 80 in the present example has a split structure of the upper dummy conductive portion 34 and the lower gate conductive portion 35. Because the dummy trench portion 30 has the lower gate conductive portion 35, the $C_{CG}$ is formed via the lower gate conductive portion 35. Because the $C_{CG}$ is provided in this manner in the present example, occurrence of the oscillation phenomenon can be suppressed even if the ratio of the occupancy area of the dummy trench portion 30 with respect to the gate trench portion 40 is higher, compared to the case where the dummy trench portion 30 does not have the conductive portion of the gate potential.

Figure 4:
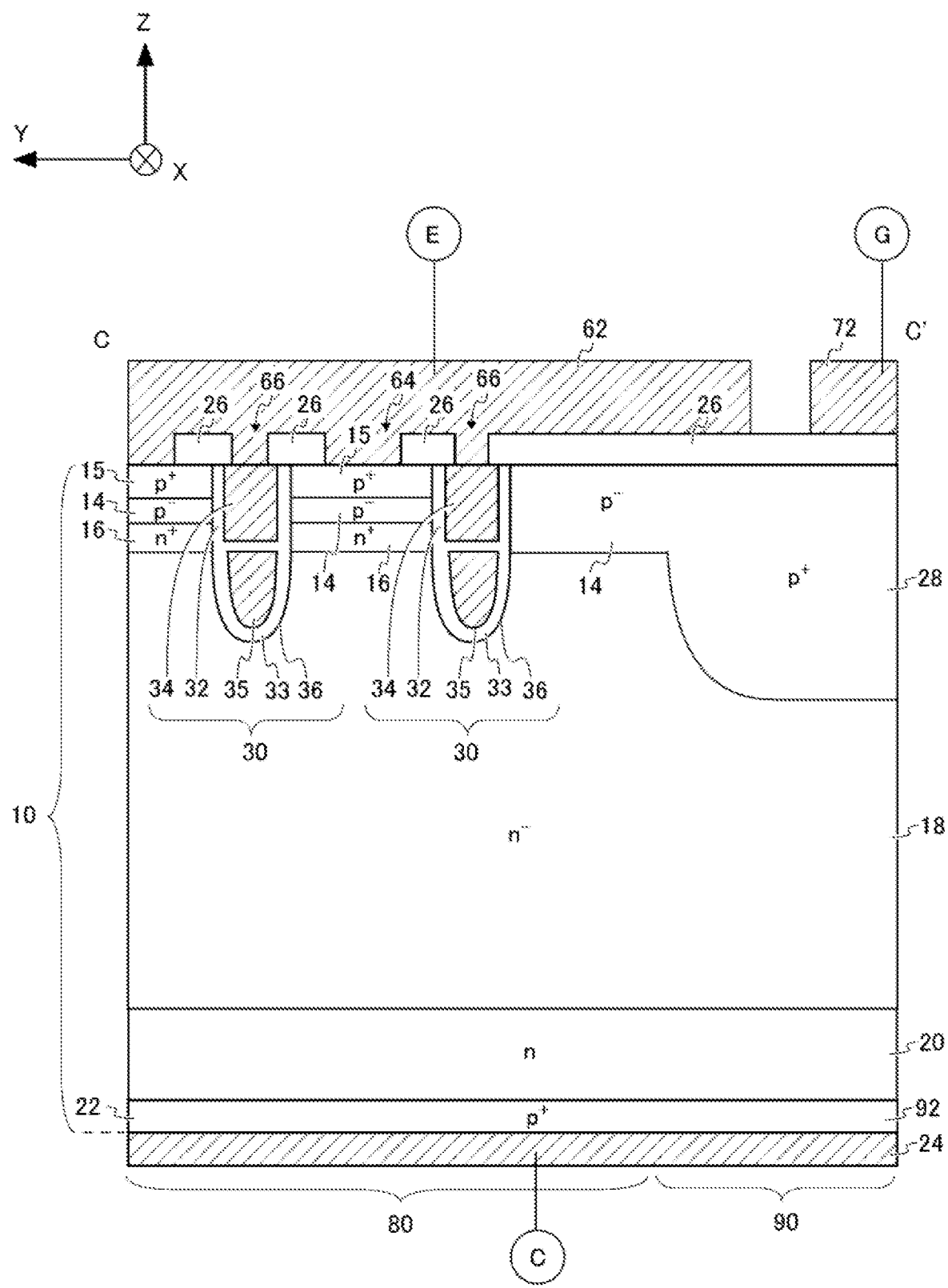
FIG. 4 shows a cross section taken along C-C' in FIG. 1.

FIG. 4 shows a cross section taken along C-C' in FIG. 1. The C-C' cross section is a cross-sectional view that passes through the dummy trench portion 30 of the IGBT section 80. The lower gate conductive portion 35 may be provided below the base region 14. The lower gate conductive portion 35 of the present example is provided below the accumulation region 16. With this, the bottom portion and the side portion of the lower insulating film 33 encapsulating the lower gate conductive portion 35 are in contact with the drift region 18. In contrast, The upper insulating film 32 is not in contact with the drift region 18.

The lowest end of the upper dummy conductive portion 34 may be positioned between the upper end and the lower end of the accumulation region 16. The potential of the upper dummy conductive portion 34 is the same as that of the emitter electrode 62. Also, the doping concentration of the n-type impurities in the drift region 18 is, for example, about $1 \times 10^{14}/cm^3$ or less. When turning on the IGBT, the potential of the drift region 18 fluctuates due to influences of charge carriers (electrons, holes). If the lowest end of the upper dummy conductive portion 34, having the same potential as the emitter electrode, reaches the drift region 18, a hole inversion layer is easily formed on the side wall of the trench portion in contact with the drift region 18. Holes enter the base region 14 through this hole inversion layer, making it difficult to perform the conductivity modulation. Therefore, the turn-on time becomes longer. On the other hand, because the accumulation region 16 has a higher doping concentration than the drift region 18, the voltage threshold at which the hole inversion layer is formed is higher than that of the drift region 18. Therefore, if the lowest end of the upper dummy conductive portion 34 is positioned between the upper end and the lower end of the accumulation region 16, almost no hole inversion layer is formed and the turn-on time can be shortened.

The following describes one example of the manufacturing method of the lower gate conductive portion 35 shown in FIG. 4. First, dummy trenches 36 and gate trenches 46 extending in the array direction are formed on the front surface of the semiconductor substrate 10. Next, an insulating film that covers the inner walls of the dummy trenches 36 and the gate trenches 46 is formed. The insulating film may be silicon dioxide. Next, polysilicon is formed inside the dummy trench portion 30 and the gate trench portion 40. Thereby, the insulating film 42 and the gate conductive portion 44 in the gate trench portion 40 are formed.

Next, the gate trench portion 40 and the like are covered by a mask material, and only the dummy trench portion 30 is made to be exposed from the mask material. And, the insulating film and polysilicon inside the dummy trench portion 30 are partially removed by etching. After the etching, the polysilicon left inside the dummy trench portion 30 is made to be the lower gate conductive portion 35, and the insulating film left on the inner wall of the dummy trench 36 is made to be the lower insulating film 33.

Next, an insulating film is formed on the lower gate conductive portion 35. The insulating film may also be silicon dioxide. Thereby, the upper insulating film 32 is formed. Next, polysilicon is formed being in contact with the upper insulating film 32 inside the dummy trench portion 30. Next, the polysilicon is removed, leaving the portions in which the upper dummy conductive portion 34 is to be formed. Thereby, the structure shown in the Y-Z cross section in FIG. 4 can be formed.

FIG. 5 shows a cross section taken along D-D' in FIG. 1. The D-D' cross section is a cross-sectional view that passes through the dummy trench portion 30 of the IGBT section 80 and the dummy trench portion 50 of the FWD section 90. In the present example, the conductive portion of the dummy trench portion 30 in the IGBT section 80 has an upper dummy conductive portion 34 and a lower gate conductive portion 35. In contrast, the conductive portion of the dummy trench portion 50 of the FWD section 90 has only the dummy conductive portion 54.

As a first modification example of the first embodiment, the dummy trench portion 50 may have an upper dummy conductive portion 34 and a lower gate conductive portion 35. That is, each of the dummy trench portions 30 and 50 in the IGBT section 80 and the FWD section 90 may have the upper dummy conductive portion 34 and the lower gate conductive portion 35. Thereby, the imbalance in the potential distribution on the front surface side of the semiconductor substrate 10 can be eliminated.

FIG. 6A is a diagram showing a mesa region 19, a dummy trench portion 30 and a gate trench portion 40 in a first embodiment. In FIG. 6A, for the sake of description, only the mesa regions 19, the dummy trench portions 30 and the gate trench portions 40 of the IGBT section 80 are shown, and other configurations are omitted. Note that, the boundaries between the dummy trench portion 30 and the gate trench portion 40 are indicated by dotted lines.

In the present example, the plurality of mesa regions 19 are provided in a so-called grid patterns. That is, the plurality of mesa regions 19 are provided being arranged side by side linearly in the first direction and the second direction. That is, respective mesa regions 19 arranged in the X-direction have the same positions of the mesa regions 19 in the Y-direction. Also, respective mesa regions 19 arranged in the Y-direction have the same positions of the mesa regions 19 in the X-direction.

In this manner, dummy trench portions 30 and the gate trench portions 40 can obtain carrier accumulation effect by surrounding respective mesa regions 19.

FIG. 6B is a diagram showing a mesa region 19, a dummy trench portion 30 and a gate trench portion 40 in a second modification example of the first embodiment. Note that, in FIG. 6B, for ease of description, the boundaries between the dummy trench portion 30 and the gate trench portion 40 are indicated by solid lines. Also in FIG. 6B, like in FIG. 6A, the mesa regions 19, the dummy trench portions 30 and the gate trench portions 40 of the IGBT section 80 are shown.

In the present example, the plurality of mesa regions 19 are provided in a so-called hound's tooth patterns. The plurality of mesa regions 19 in the present example include a first group 119-1, a second group 119-2 which is the closest to the first group 119-1 in the +Y-direction, and a third group 119-3 which is second closest to the first group 119-1 in the +Y-direction.

In the first group 119-1, the second group 119-2, and the third group 119-3, respective mesa regions 19 are provided being arranged side by side linearly in the X-direction. Each mesa region 19 of the second group 119-2 is provided so as to be shifted from each other by a half period in the X-direction with respect to each mesa region 19 of the first group 119-1. Note that, one period for the mesa region 19 in the present example means the length between the centers of the mesa regions 19 adjacent to the X-direction. A half period means half the length of the one period.

Each mesa region 19 of the third group 119-3 is provided being arranged side by side in the Y-direction with respect to each mesa region 19 of the first group 119-1. In the present example, respective mesa regions 19 of the first group 119-1 have the same positions of the centers in the X-direction with respective mesa regions 19 of the third group 119-3. A fourth group 119-4 similar to the second group 119-2 may be provided being adjacent to in the +Y-direction of the third group 119-3. In this manner, the configuration of the first group 119-1 and the second group 119-2 may be periodically repeated in the Y-direction. Note that, the FWD section 90 may have the arrangement of the mesa region 19 similar to the IGBT section 80. The present example can also obtain carrier accumulation effect like the example in FIG. 6A.

Figure 7:
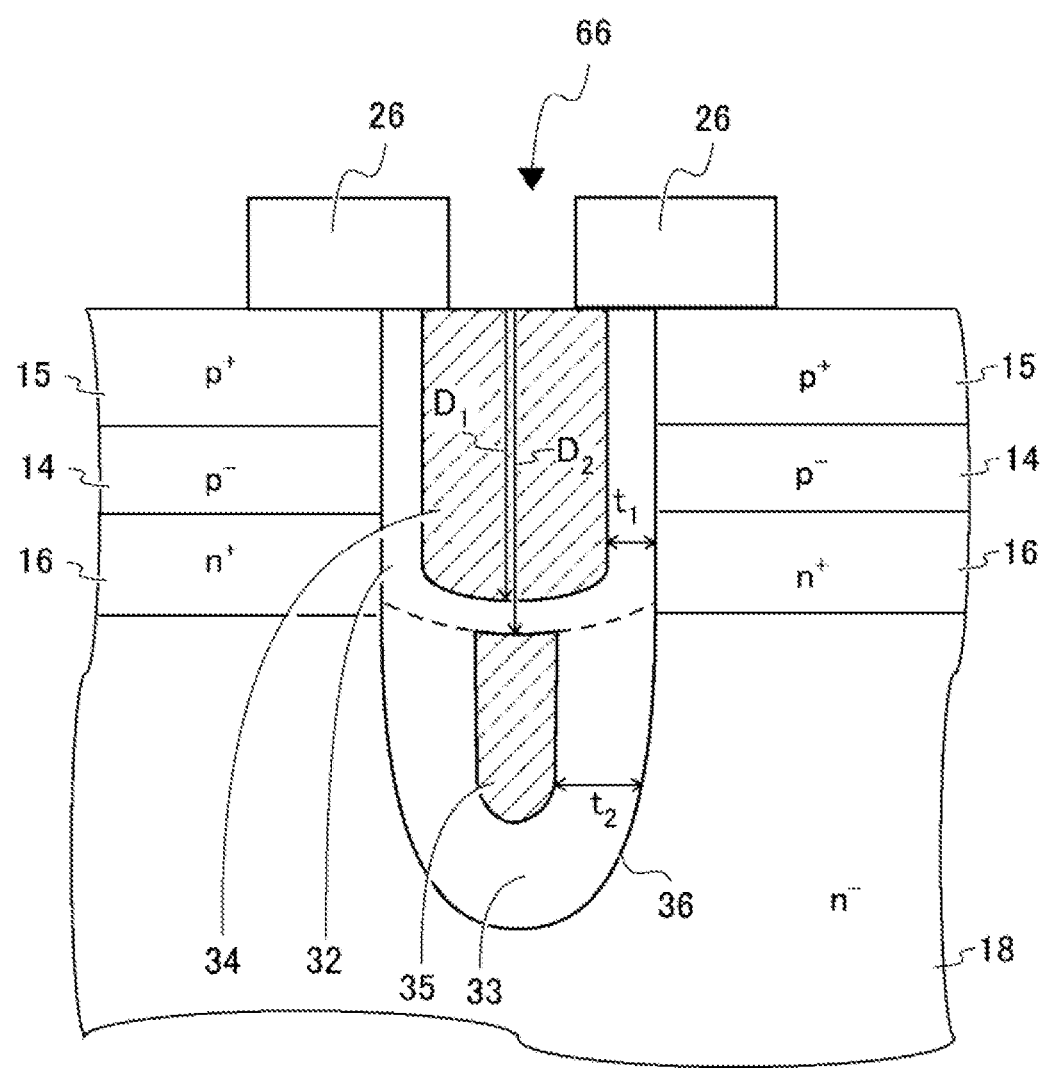
FIG. 7 shows a modification example of the dummy trench portion 30.

FIG. 7 shows a modification example of the dummy trench portion 30. The boundaries between the upper insulating film 32 and the lower insulating film 33 are indicated by dotted lines. However, if the upper insulating film 32 and the lower insulating film 33 are made of the same material, the boundaries may not be observable. The upper insulating film 32 is provided on a side portion and a bottom portion of the upper dummy conductive portion 34. The lower insulating film 33 is provided at the side portion and the bottom portion of the lower gate conductive portion 35, in addition to between the bottom portion of the upper dummy conductive portion 34 and the top portion of the lower gate conductive portion 35 The thickness $t_2$ of the lower insulating film 33 of the present example is larger than the thickness $t_1$ of the upper insulating film 32. Also in such a configuration, it is possible to secure a $C_{CG}$ that suppresses the oscillation phenomenon.

In the present example, the depth from the front surface to the bottom portion of the upper dummy conductive portion 34 is $D_1$, and the depth from the front surface to the top portion of the lower gate conductive portion 35 is $D_2$. In the present example, the depth $D_2$ is larger than the depth $D_1$. The depth $D_1$ in the present example is deeper than the base region 14, and is shallower than the boundary between the accumulation region 16 and the drift region 18. That is, the bottom portion of the upper dummy conductive portion 34 of the present example is positioned in the same depth range as the accumulation region 16. The top portion of the lower gate conductive portion 35 may be provided at a position deeper than the depth $D_1$.

Figure 8:
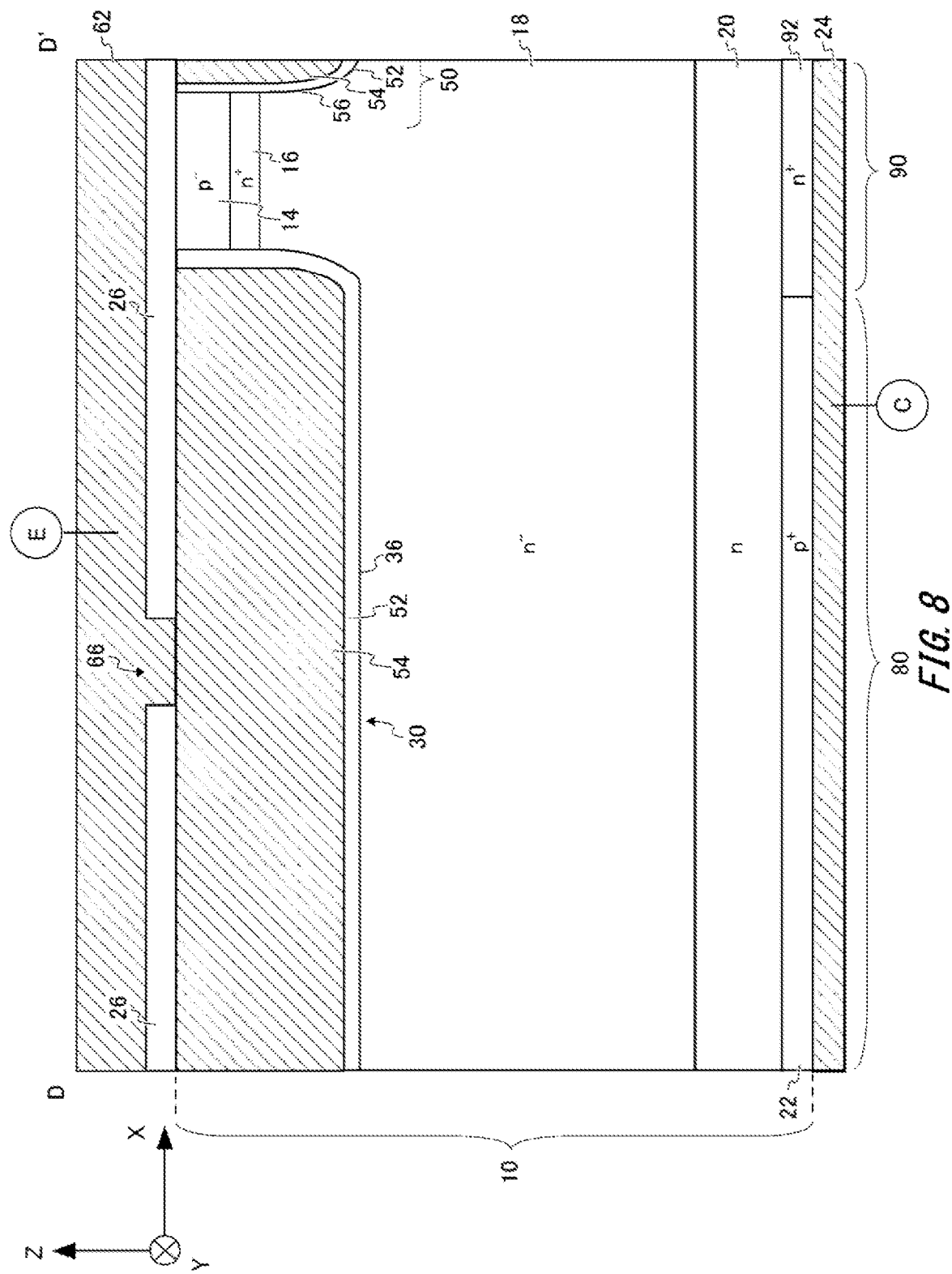
FIG. 8 shows a cross section taken along D-D' of a semiconductor device 100 in a second embodiment.

FIG. 8 shows a cross section taken along D-D' of a semiconductor device 100 in a second embodiment. At least one dummy trench portion 30 of a plurality of the dummy trench portions 30 may not have the lower gate conductive portion 35. In the present example, the dummy trench portion 30 positioned at the −Y-direction end portion does not have the lower gate conductive portion 35. The dummy trench portion 30 positioned at the −Y-direction end portion has an insulating film 52 and a dummy conductive portion 54 inside the dummy trench 36, similar to the dummy trench portion 50. Although the present example is different from the first embodiment in this point, the present example can also obtain the similar advantageous effects as the first embodiment. Also, the present example may be combined with the modification example in the first embodiment.

Note that, in the case where all the conductive portions are the dummy conductive portions 54 as in the dummy trench portions 30 and 50 in the present example, a manufacturing method different from that of the first embodiment may be adopted. For example, all polysilicon inside the dummy trench portion 30 is removed by etching. After that, by forming polysilicon on the entire dummy trench portion 30, the dummy conductive portion 54 may be formed.

Figure 9:
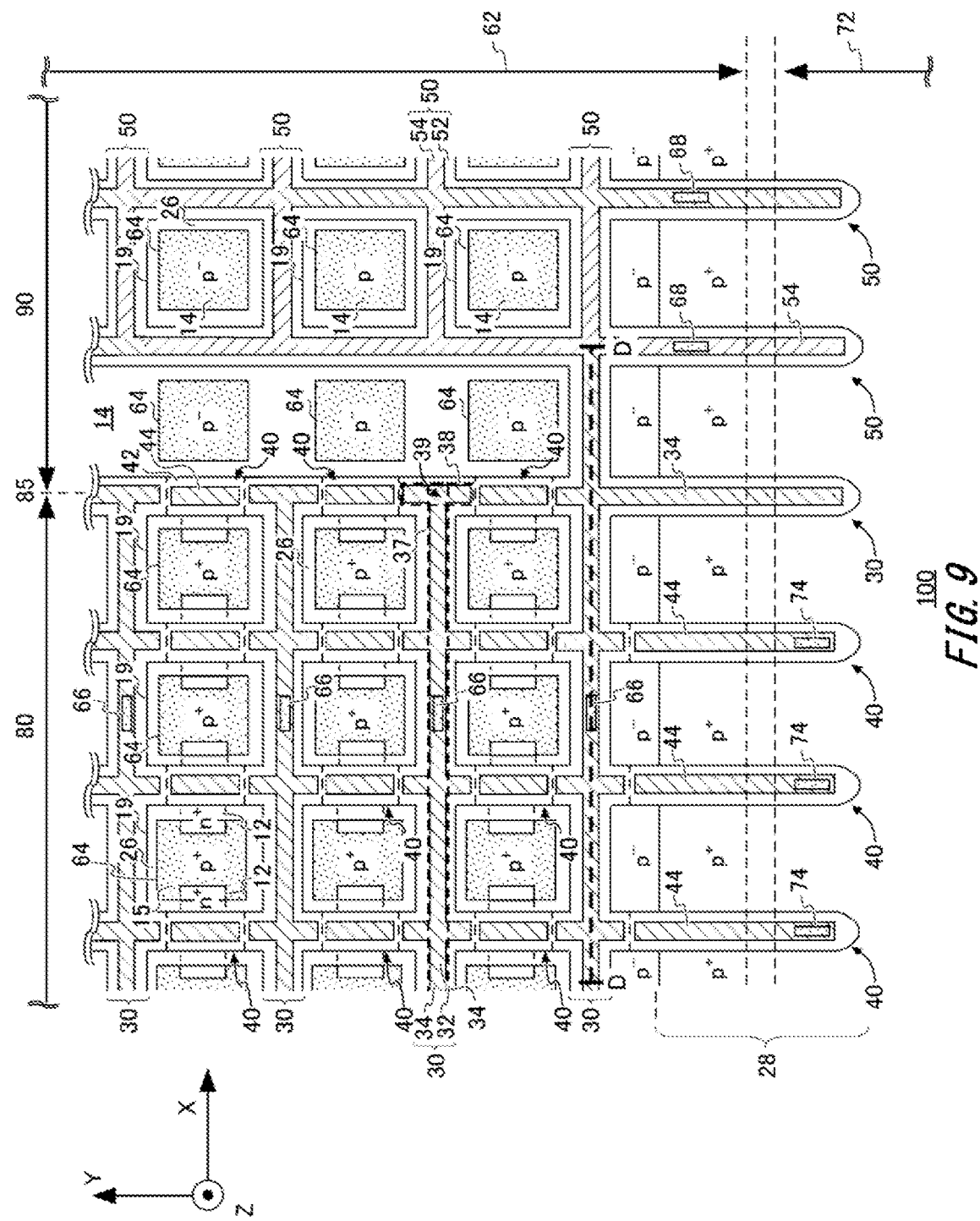
FIG. 9 is a top view of a semiconductor device 100 according to a third embodiment.

FIG. 9 is a top view of a semiconductor device 100 according to a third embodiment. In the present example, the first straight line portion of the dummy trench portion 30 in the IGBT section 80 extends in the +X-direction and is coupled to the dummy trench portion 50 in the FWD section 90.

Figure 10:
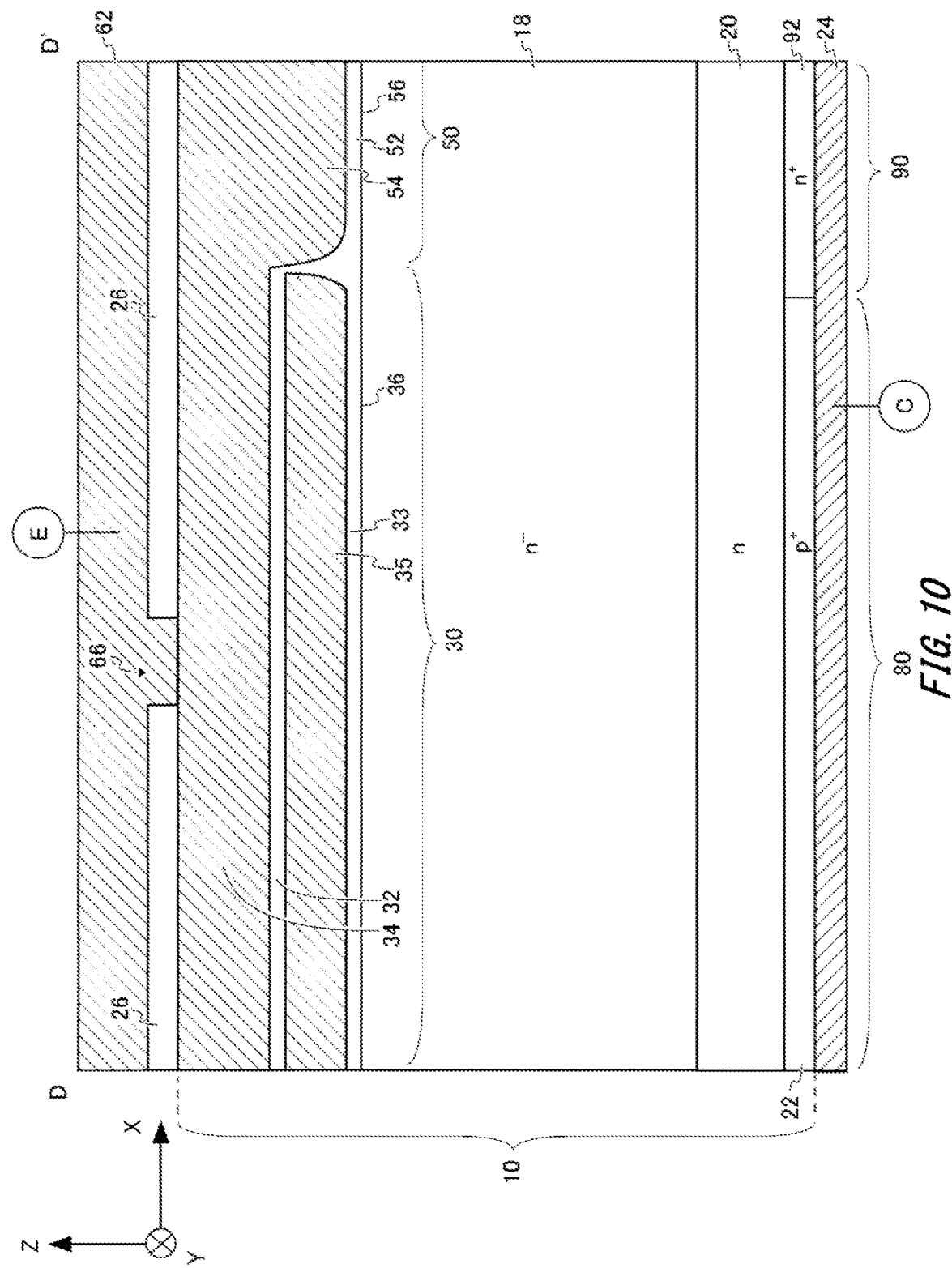
FIG. 10 shows a cross section taken along D-D' of a semiconductor device 100 in a third embodiment.

FIG. 10 shows a cross section taken along D-D' of a semiconductor device 100 in a third embodiment. The dummy trench portion 30 of the present example has an upper dummy conductive portion 34 and a lower gate conductive portion 35 similar to the first embodiment. The lower gate conductive portion 35 terminates at the boundary portion 85. However, the upper dummy conductive portion 34 is coupled to the dummy conductive portion 54 in the FWD section 90. Although the present example is different from the first embodiment in this point, the present example can also obtain the similar advantageous effects as the first embodiment. Also, the present example may be combined with the modification example in the first embodiment and the second embodiment.

Figure 11:
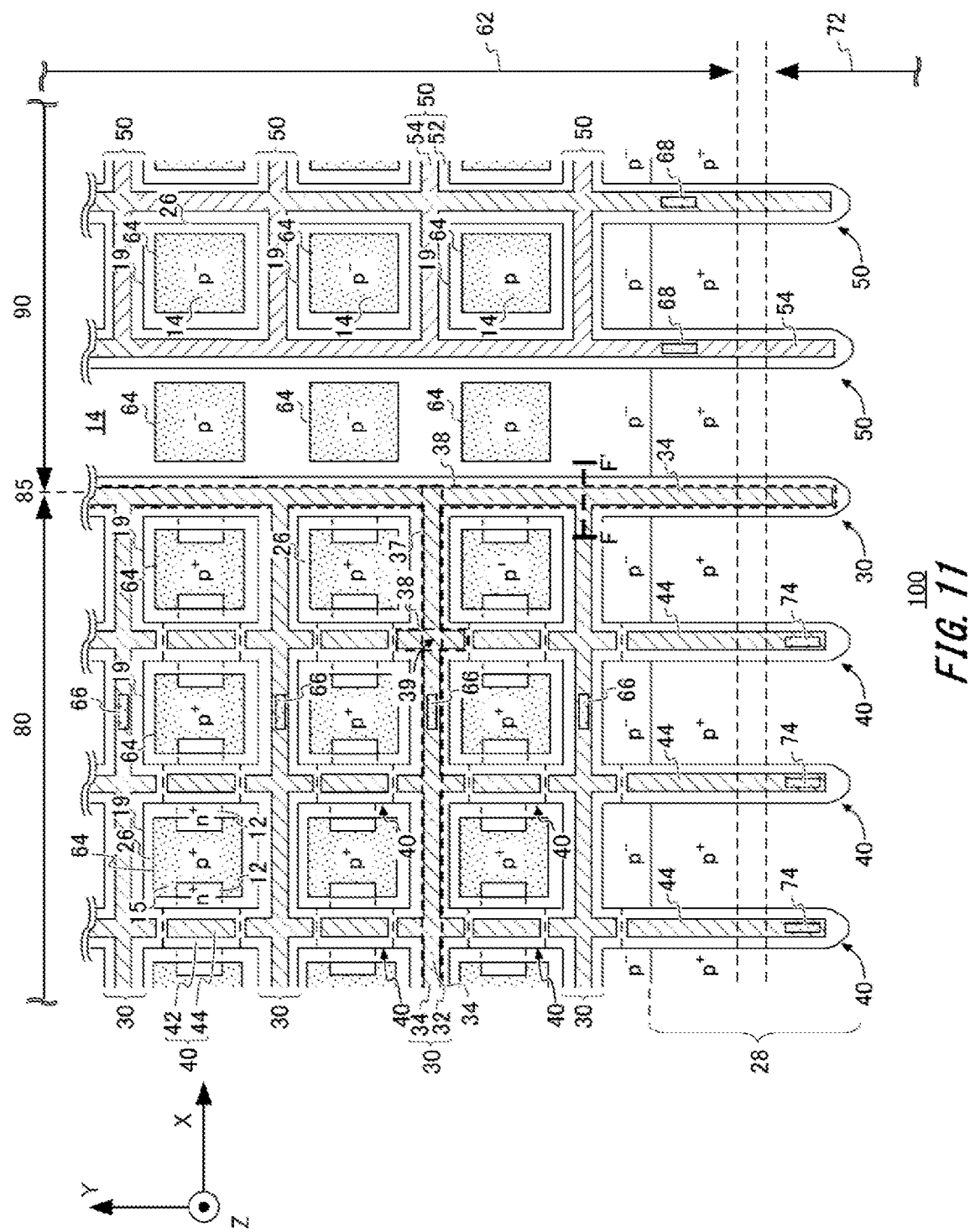
FIG. 11 is a top view of a semiconductor device 100 according to a fourth embodiment.

FIG. 11 is a top view of a semiconductor device 100 according to a fourth embodiment. In the present example, the dummy trench portion 30 is arranged and the gate trench portion 40 is not arranged at the boundary portion 85. That is, in the plurality of the second straight line portions 38 closest to the FWD section 90 among the plurality of dummy trench portions 30, second straight line portions 38 adjacent to each other in the Y-direction may be coupled to each other. In the present example, the dummy trench portion 30 of the boundary portion 85 does not have the lower gate conductive portion 35. That is, in the present example, the dummy trench portion 30 of the boundary portion 85 has the insulating film 52 and the dummy conductive portion 54, similar to the dummy trench portion 50 of the FWD section 90.

Figure 12:
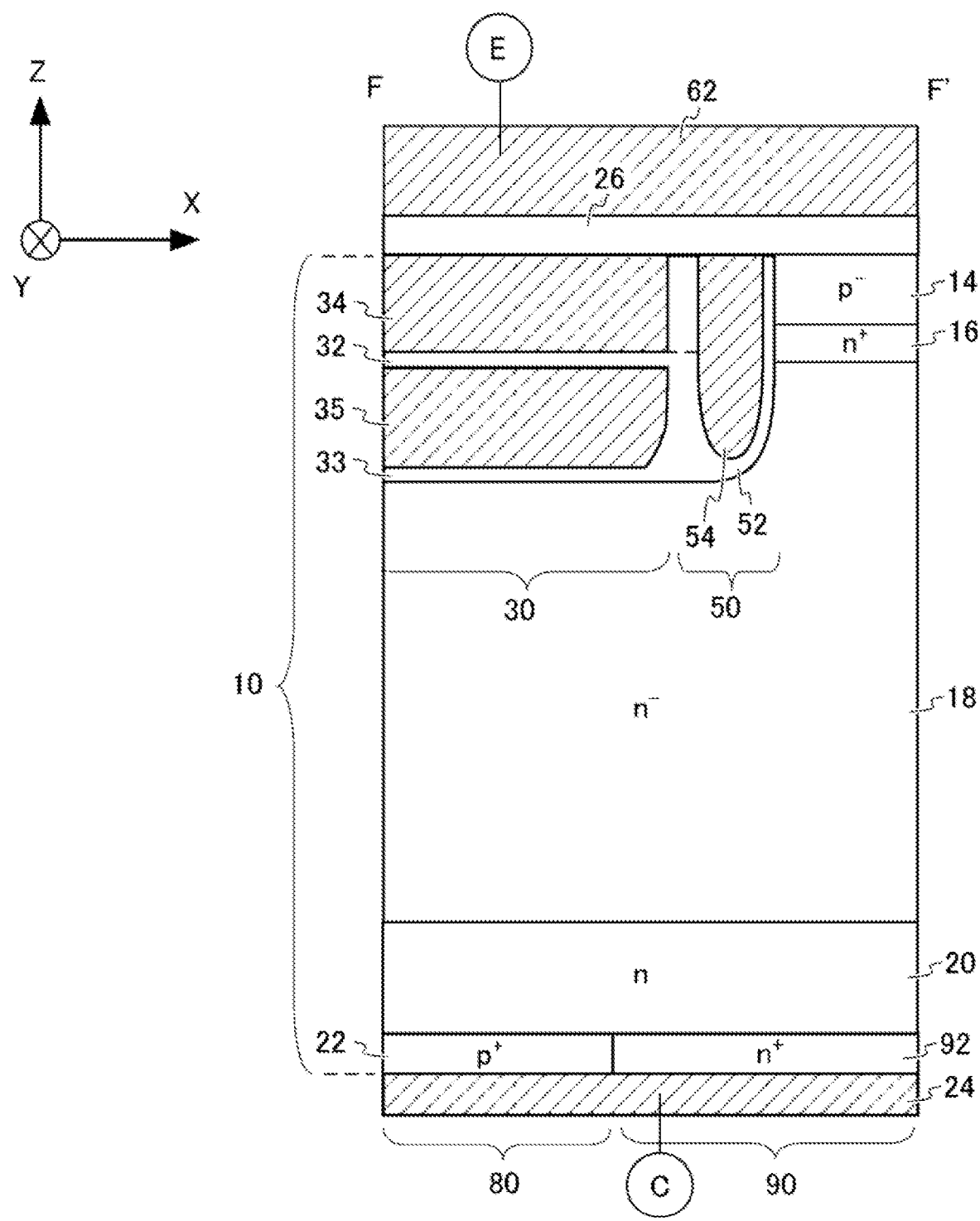
FIG. 12 shows a cross section taken along F-F' of a semiconductor device 100 in a fourth embodiment.

FIG. 12 shows a cross section taken along F-F' of a semiconductor device 100 in a fourth embodiment. In FIG. 12, as indicated by solid lines, the upper dummy conductive portion 34 of the dummy trench portion 30 and the dummy conductive portion 54 of the dummy trench portion 30 at the boundary portion 85 are spaced away from each other. However, in another example, as indicated by dotted lines, the upper dummy conductive portion 34 may be coupled to the dummy conductive portion 54. Although the present example is different from the first embodiment in this point, the present example can also obtain the similar advantageous effects as the first embodiment. Also, the present example may be combined with the modification example in the first embodiment, the second embodiment, and the third embodiment.

Figure 13:
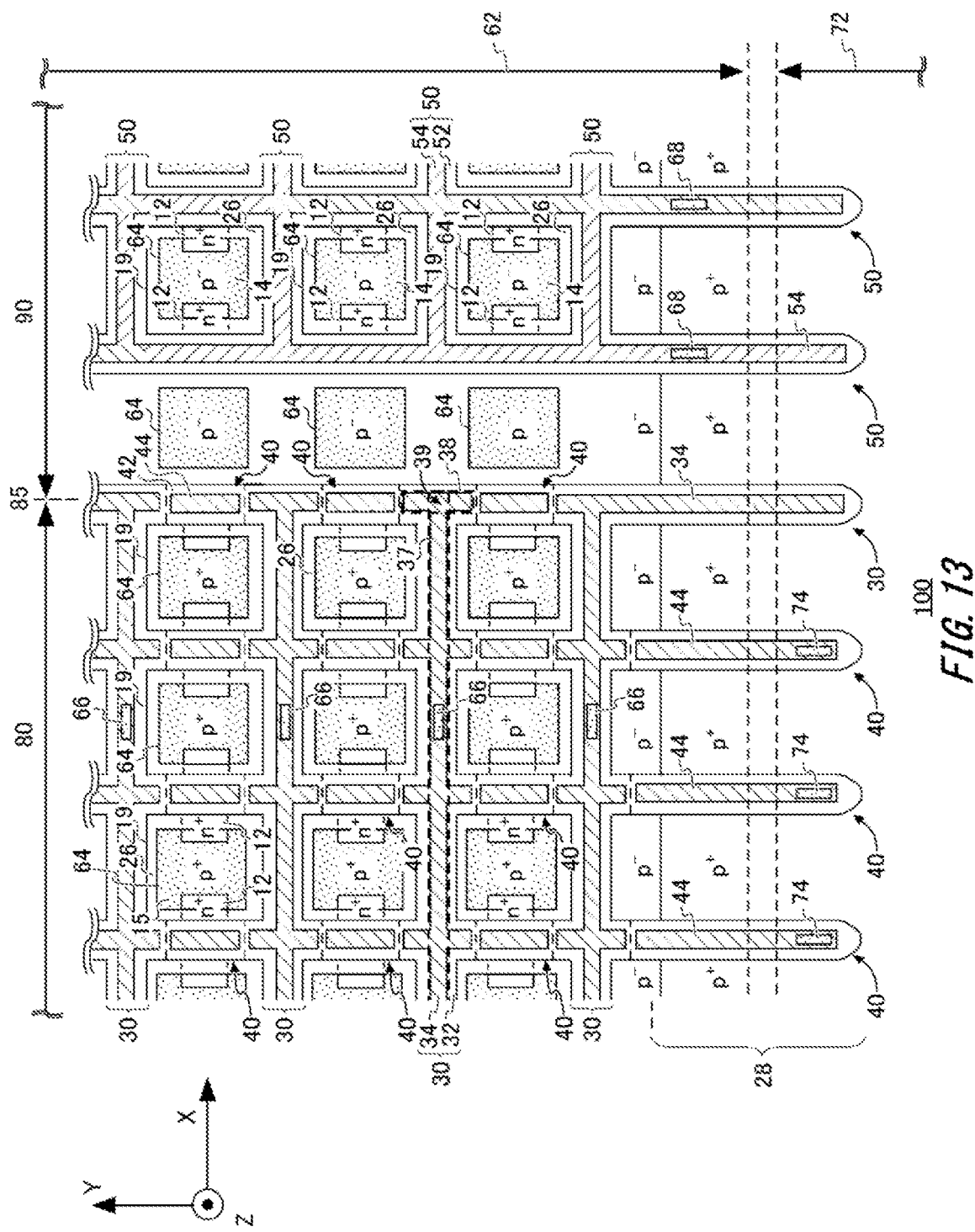
FIG. 13 is a top view of a semiconductor device 100 according to a fifth embodiment.

FIG. 13 is a top view of a semiconductor device 100 according to a fifth embodiment. In the present example, the mesa region 19 of the FWD section 90 has the emitter region 12 similar to the mesa region 19 of the IGBT section 80. Although the present example is different from the first embodiment in this point, the present example can also obtain the similar advantageous effects as the first embodiment. Also, the present example may be combined with the modification example in the first embodiment, the second embodiment, the third embodiment, and the fourth embodiment.

Figure 14:
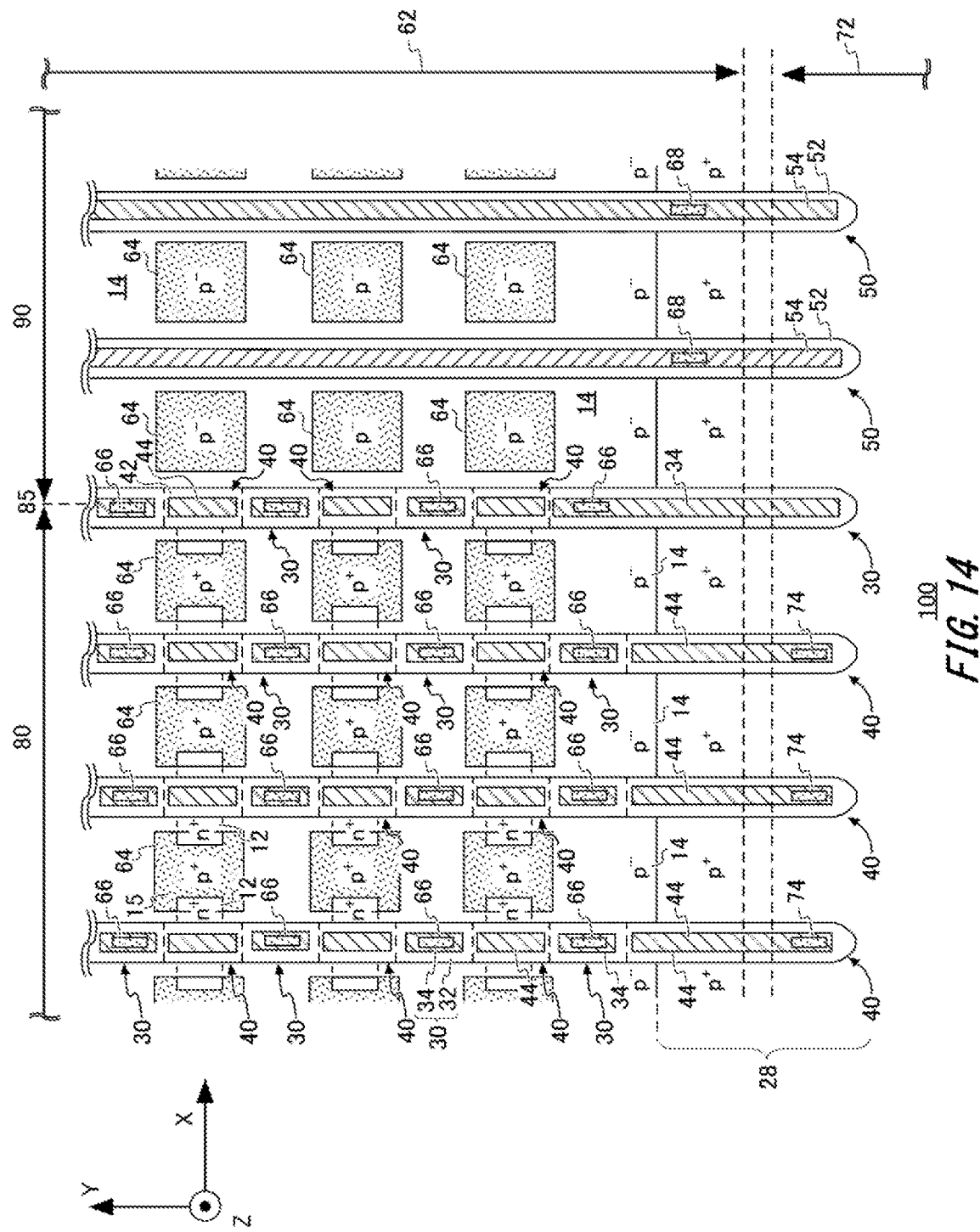
FIG. 14 is a top view of a semiconductor device 100 according to a sixth embodiment.

FIG. 14 is a top view of a semiconductor device 100 according to a sixth embodiment. Note that, in FIG. 14, the interlayer insulating film 26 is omitted. The dummy trench portions 30 and 50 of the present example have a so-called stripe shape. The dummy trench portions 30 and 50 of the present example are provided in parallel to the Y-direction. The dummy trench portion 30 does not have a first straight line portion 37, and has only a second straight line portion 38. Therefore, the dummy trench portion 30 does not have an intersecting portion 39. In the present example, contact holes 66 for electrically connecting the upper dummy conductive portion 34 and the emitter electrode 62 are provided on the respective second straight line portions 38 of the plurality of dummy trench portions 30. Although the present example is different from the first embodiment in this point, the present example can also obtain the similar advantageous effects as the first embodiment. Also, the present example may be combined with the modification example in the first embodiment. The present example may also be combined with the fourth embodiment or the fifth embodiment.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES

10 . . . semiconductor substrate; 12 . . . emitter region; 14 . . . base region; 15 . . . contact region; 16 . . . accumulation region; 18 . . . drift region; 19 . . . mesa region; 20 . . . buffer region; 22 . . . collector region; 24 . . . collector electrode; 26 . . . interlayer insulating film; 28 . . . well region; 30 . . . dummy trench portion; 32 . . . upper insulating film; 33 . . . lower insulating film; 34 . . . upper dummy conductive portion; 35 . . . lower gate conductive portion; 36 . . . dummy trench; 37 . . . first straight line portion; 38 . . . second straight line portion; 39 . . . intersecting portion; 40 . . . gate trench portion; 42 . . . insulating film; 44 . . . gate conductive portion; 46 . . . gate trench; 50 . . . dummy trench portion; 52 . . . insulating film; 54 . . . dummy conductive portion; 56 . . . dummy trench; 62 . . . emitter electrode; 64, 66, 68 . . . contact hole; 72 . . . gate metal layer; 74 . . . contact hole; 80 . . . IGBT section; 85 . . . boundary portion; 90 . . . FWD section; 92 . . . cathode region; 100 . . . semiconductor device; 119 . . . group

What is claimed is:

1. A semiconductor device comprising:
a first conductivity-type semiconductor substrate;
a second conductivity-type base region provided at a front surface side inside the semiconductor substrate,
a gate trench portion provided inside the semiconductor substrate and penetrating through the base region from a front surface of the semiconductor substrate, the gate trench portion having a gate conductive portion, and
a dummy trench portion provided inside the semiconductor substrate and penetrating through the base region from the front surface of the semiconductor substrate, the dummy trench portion including an upper dummy conductive portion configured to carry an emitter potential and a lower gate conductive portion positioned below the upper dummy conductive portion and being configured to have a gate potential,
wherein the lower gate conductive portion of the dummy trench portion is electrically connected to the gate conductive portion of the gate trench portion, and
the gate conductive portion and the lower gate conductive portion together surround the upper dummy conductive portion in cross-section in at least one direction.

2. The semiconductor device according to claim 1, wherein
in the front surface of the semiconductor substrate, a plurality of the gate trench portions and a plurality of the dummy trench portions surround a mesa region provided in a transistor section of the semiconductor device and having the base region.

3. The semiconductor device according to claim 2, wherein
in the front surface of the semiconductor substrate, each of the plurality of the dummy trench portions has:
a first straight line portion extending in a first direction,
a second straight line portion extending in a second direction, the second direction being orthogonal relative to the first direction, and
an intersecting portion in which the first straight line portion and the second straight line portion intersect with each other.

4. The semiconductor device according to claim 3, wherein
in the front surface of the semiconductor substrate, a plurality of the mesa regions are provided being arranged side by side linearly in the first direction and the second direction.

5. The semiconductor device according to claim 3, wherein
in the front surface of the semiconductor substrate, a plurality of the mesa regions are provided in the transistor section of the semiconductor device and each respectively have a base region including:
a first group within the plurality of the mesa regions, in which respective mesa regions are provided being arranged side by side linearly in the first direction,
a second group within the plurality of the mesa regions, in which respective mesa regions are provided being arranged side by side linearly in the first direction, each mesa region of the second group within the plurality of the mesa regions is a closest one of the second group to the first group in the second direction, and each of the second group within the plurality of the mesa regions is provided so as to be shifted from each other by a half period in the first direction with respect to each mesa region of the first group, and
a third group within the plurality of the mesa regions, in which respective mesa regions are provided being arranged side by side linearly in the first direction, each mesa region of the third group within the plurality of the mesa regions is a second closest one of the third group to the first group in the second direction, and each mesa region of the third group within the plurality of the mesa regions is provided being arranged side by side in the second direction with respect to each mesa region of the first group.

6. The semiconductor device according to claim 4, wherein
the dummy trench portion is provided in direct contact with a side parallel to the first direction of the plurality of the mesa regions on the front surface of the semiconductor substrate, and
the gate trench portion is provided in direct contact with a side parallel to the second direction of the plurality of the mesa regions on the front surface of the semiconductor substrate.

7. The semiconductor device according to claim 1, further comprising a diode section adjoined to a transistor section of the semiconductor device, wherein
the transistor section comprises a plurality of the dummy trench portions each having a respective one of a plurality of the lower gate conductive portions, and
the diode section comprises a second plurality of the dummy trench portions, each of the second plurality of dummy trench portions having at least one of the plurality of the lower gate conductive portions.

8. The semiconductor device according to claim 3, wherein
at least one of the plurality of the dummy trench portions does not have the lower gate conductive portion.

9. The semiconductor device according to claim 3, further comprising a diode section adjoined to a transistor section of the semiconductor device, wherein
in a plurality of the second straight line portions closest to the diode section among a plurality of the dummy trench portions in the transistor section, second straight line portions adjacent to each other in the second direction are coupled to each other, and
a plurality of the second straight line portions which are closest to the diode section do not have the lower gate conductive portion.

10. The semiconductor device according to claim 1, wherein
the lower gate conductive portion of the dummy trench portion is provided below the base region.

11. The semiconductor device according to claim 1, wherein the dummy trench portion has:
an upper insulating film provided on a side portion and a bottom portion of the upper dummy conductive portion, and
a lower insulating film provided on a side portion and a bottom portion of the lower gate conductive portion, the lower insulating film being thicker than the upper insulating film.

12. The semiconductor device according to claim 11, wherein
the semiconductor substrate has a first conductivity-type drift region positioned below the base region,
the upper insulating film of the dummy trench portion is not in contact with the drift region, and
the lower insulating film of the dummy trench portion is in contact with the drift region.

\* \* \* \* \*